United States Patent [19]
Schlott et al.

[11] Patent Number: 5,660,599
[45] Date of Patent: Aug. 26, 1997

[54] PROCESS FOR THE RECYCLING OF SPENT INDIUM OXIDE-TIN OXIDE SPUTTERING TARGETS

[75] Inventors: Martin Schlott, Hanau; Wolfgang Dauth, Frankfurt am Main; Martin Kutzner, Neuberg, all of Germany

[73] Assignee: Leybold Materials GmbH, Hanau, Germany

[21] Appl. No.: 524,468

[22] Filed: Sep. 7, 1995

[30] Foreign Application Priority Data

Oct. 27, 1994 [DE] Germany .................. 44 38 323.1

[51] Int. Cl.⁶ .................. C05B 19/00; C23D 14/00; F27B 9/04; B29C 59/00
[52] U.S. Cl. .................. 264/122; 23/313 R; 23/293 R; 204/192.1
[58] Field of Search .................. 23/313 R, 293 R; 204/192.1; 264/65, 122

[56] References Cited

U.S. PATENT DOCUMENTS

| | | | |
|---|---|---|---|
| 4,690,745 | 9/1987 | Klein | 204/192.29 |
| 4,962,071 | 10/1990 | Bayard | 501/134 |
| 5,282,946 | 2/1994 | Kinoshita | 204/192.2 |
| 5,480,532 | 1/1996 | Schott et al. | 204/192.29 |
| 5,522,535 | 6/1996 | Ivanov et al. | 228/122.1 |
| 5,531,948 | 7/1996 | Schott et al. | 264/122 |

*Primary Examiner*—Gary P. Straub
*Attorney, Agent, or Firm*—Felfe & Lynch

[57] ABSTRACT

Compacted ITO material is ground to a powder with particles in the size range of less than 500 μm, whereupon the powder thus obtained is molded into new target blanks, either alone or in a mixture with unused ITO powder, under the simultaneous action of pressure and temperature. The temperature is kept sufficiently low so that recrystallization does not take place and the original grain size is preserved.

4 Claims, No Drawings

PROCESS FOR THE RECYCLING OF SPENT INDIUM OXIDE-TIN OXIDE SPUTTERING TARGETS

BACKGROUND OF THE INVENTION

The invention pertains to a process for the recycling of spent indium oxide-tin oxide sputtering targets (ITO targets) and of compacted material residues left over from the production of such targets. The process is applicable particularly in the case of partially reduced targets.

Oxide ceramic targets of indium-tin oxide (ITO) are used for the production of thin, transparent, electrically conductive layers by sputtering. Such layers are used especially in flat-screen technology. The thin indium oxide-tin oxide layers can be produced either by the sputtering of metal targets in a reactive oxygen atmosphere or by the sputtering of oxide ceramic targets.

The sputtering process with oxide ceramic targets offers the advantage that, because of the minimal flow of oxygen in the sputtering chamber, it is easier to regulate the sputtering process than it is when metal targets are sputtered, which requires high oxygen flow rates.

With respect to solid oxide targets of $In_2O_3+SnO_2$, targets which have a substoichiometric oxygen content offer the advantage that the oxygen content crucial to the conductivity of the layer can be adjusted over a wider range while the layer is being sputtered on. In addition, the working range, that is, the range of optimum layer conductivity as a function of the oxygen flux, is wider with these partially reduced targets than it is with solid oxide targets.

The production of these partially reduced targets is quite complicated and expensive. Suitable processes are described, for example, in U.S. Pat. Nos. 4,690,745 and 4,962,071, and in DE-OS 44 07 774 to which U.S. Pat. No. 5,480,532 corresponds.

A significant portion of the target cost is attributable to the high price of the raw material indium oxide. Depending on the sputtering cathode used, spent sputtering targets still contain 60–80% of their original weight. These spent targets would therefore still be quite valuable if it were possible to reuse them again as a raw material.

A solution to this problem already implemented in practice consists in dissolving the spent targets in an acid solution (e.g., as $InCl_3$) and to return this solution to the very beginning of the material cycle, i.e., before the step in which the powder is produced. Because all the steps of powder production must be carried out again, this is a very time-consuming and expensive process. In addition, it is necessary to work with corrosive or toxic chemicals, which often presents a problem to the target manufacturer. Another disadvantage of this process is that, because of the associated system technology, operations can be carried out economically only when very large amounts of material are available, and all of the know-how of powder production is required.

SUMMARY OF THE INVENTION

The invention provides an easy, low-cost process for the recycling of spent ITO sputtering targets and other compact pieces of ITO which accumulate during the production process, this process being simple enough to be carried out right in the target producer's plant. One of the particular goals is to make possible the recycling of highly compacted, partially reduced ITO targets. The ITO targets produced from the recycled material are not noticeably inferior to ITO targets of unused powder with respect to either purity, mechanical properties, or sputtering behavior.

In accordance with the invention the ITO material is ground into a powder with a particle size of less than 500 µm, the bulk of the powder having a particle size over 100 µm. The powder thus obtained is molded, either alone or in a mixture with unused ITO powder, into new target blanks under the simultaneous action of pressure and temperature.

The particles are preferably ground to a size less than 250 µm and densified by hot isostatic pressing. Since the temperatures are relatively low compared to a sintering process, which exhibits strong recrystallization and grain growth, the microstructure of the resulting compacted bodies consists essentially of the 0.1 µm to 10 µm primary grains which made up the original target.

In laboratory tests with small amounts of material, the surprising discovery was made that partially reduced, highly compact ITO material can be compacted again easily into target disks with more than 95% of the theoretical density even after only a moderate grinding to a particle size range of <250 µm, provided that, during the compaction step, a sufficiently high pressure is applied. The degree of reduction of the starting material remains nearly unchanged during all this, as long as the powder, before compaction, is welded into capsules, as is normally done for hot isostatic pressing. The mechanical properties and the sputtering behavior of such recycled targets are the same as those of unused ITO targets. Over the course of further development work, it was found that both partially reduced and solid oxide ITO materials can be processed into new targets by grinding up the starting material to particles in the size range of <250 µm and by compacting the resulting powder by HIP (hot isostatic pressing). In contrast to other compacting processes, such as hot pressing and sintering, it is possible in the HIP process, because of the high compaction pressure, to choose a process temperature so low that no significant recrystallization takes place. In this way, a previously compacted powder can be recompacted without having to be ground up into particles in the size range of the primary bodies (typically <1 µm). This is the size range of the crystal grains in the indium-oxide and tin-oxide powders used for the original target fabrication. For compaction by hot pressing or especially by sintering, there is no choice but to grind up the material to this degree of fineness. Only then does the powder have enough sintering activity during this low-pressure compaction process to be processed successfully into bodies of sufficient density. Compaction by HIP also makes it possible to keep the degree of reduction of the powder constant during compaction, because the compacting is carried out here in a hermetically sealed can. In contrast to this, hot pressing is usually carried out under slightly reducing conditions because of the graphite ram normally used, and pressureless sintering is carried out under an oxidizing atmosphere such as air or $O_2$.

The experiments which were conducted have also shown that it is especially easy to compact the ground-up powder when it has been produced from partially reduced targets. Both mixtures of virgin powder with recycled powder and pure recycled powder could be compacted. Because comminution to <250 µm is sufficient, the use of simpler and cheaper mills is possible. In addition, it is possible to prevent the powder from being contaminated by the grinding process without the need for complicated devices. If most of the particles in the powder are larger than 250 µm, it is no longer possible to achieve reliable compaction; the bodies which are obtained have cracks or are not sufficiently dense. When the powder is ground into particles which are significantly below 250 μm in size, the compaction process is still easy to accomplish; but these powders usually contain too many impurities as a result of the grinding process, or else it is necessary to use very expensive grinding machines such as powder crossjet mills. For the recycling process according to the present invention, standard grinding machines such as jaw breakers, ball mills, mortar mills, etc., can be used for comminution. To prevent the powder from becoming contaminated, the only measure which must be taken is to make a suitable choice of the mill parts which come in contact with the powder.

The following examples are intended to describe the production of recycled targets by the process of the invention.

EXAMPLE 1

1.2 kg of debound and cleaned tiles consisting of 10% partially reduced ITO materials with a density of 96% was first broken up with a hammer into coarse fragments. These fragments were then preground in a jaw breaker and screened to particles in the size range of <2 mm. The granulate thus obtained was ground in a mortar mill with $ZrO_2$ grinding elements and screened to particle sizes of <250 μm. The powder yield was 900 g. The content of Zr in the recycled powder was less than 100 ppm. 600 g of this powder was loaded into a lined steel can and compacted in a hot isostatic press at 800° C. and 200 MPa. The disk thus obtained had a thickness of 15.9 mm and a diameter of 83.4 mm, corresponding to 96.5% of the theoretical density. The degree of reduction of the recycled target was 9.8%. As in the case of the starting material, the primary grain size of the recycled material was in the range of 0.2–10 μm. Mechanical processing could be carried out without difficulty. ITO layers produced from the target with a size of φ75×6 mm had a resistivity of less than 200 μΩ-cm.

EXAMPLE 2

300 g of the powder obtained in Example 1 was mixed with 300 g of an unused ITO powder, also 10% partially reduced, and compacted in the same way. The resulting disk had a thickness of 15.5 mm and a diameter of 84.2 mm, corresponding to 97% of the theoretical density. The degree of reduction of the recycling target was 9.9%. The primary grain size of the material was in the range of 0.1–10 μm. Mechanical processing could be carried out without difficulty. ITO layers produced from the target with a size of φ75×6 mm had a resistivity of less than 200 μΩ-cm.

EXAMPLE 3

800 g of debound and cleaned tiles of solid oxide and 94% dense ITO material was first broken up with a hammer into coarse fragments. These fragments were preground in a jaw breaker and screened to particles in the size range of <2 mm. The granulate thus obtained was reground in a centrifugal crusher with steel grinding elements and screened to particles sizes of <250 μm. The powder yield was 564 g. The content of Fe in the recycled powder was less than 100 ppm. 500 g of this powder was loaded into a lined steel can and compacted in a hot isostatic press at 900° C. and 200 mPa. The disk thus obtained had a thickness of 14.2 mm and a diameter of 82.1 mm, corresponding to 93% of the theoretical density. As in the case of the original target, the primary grain size of the material was in the range of 0.1–8 μm. Mechanical processing could be carried out without difficulty. ITO layers produced from the target with a size of φ75×6 mm had a resistivity of about 200 μΩ-cm.

EXAMPLE 4

1.1 kg of debound and cleaned tiles of 10% partially reduced and 96% dense ITO material was first broken up with a hammer into coarse fragments. These fragments were preground in a jaw breaker and screened to particles in the size range of <2 mm. The granulate thus obtained was ground in a steel ball-filled "Attritor" under the addition of water. The average particle size was 2 μm after screening. The content of Fe in the recycled powder was 650 ppm. Because of the high Fe content, no further processing was carried out.

EXAMPLE 5

1.5 kg of debound and cleaned tiles consisting of 10.5% partially reduced ITO material with a density of 97% was first crushed with a hammer into coarse fragments. These pieces were ground in a jaw breaker and screened to particles in the size range of <1 mm. The yield was 1.25 kg. 650 g of this powder was loaded into a lined steel can and compacted in a hot isostatic press at 850° C. and 200 MPa. The disk thus obtained broke into several pieces upon removal from the capsule. The density of one of these pieces, determined by the buoyancy method, was 96% of the theoretical density.

We claim:

1. Process for recycling of compacted indium tin oxide sputtering targets consisting essentially of grains having a grain size of 0.1 to 10 μm said process comprising coarse grinding said compacted targets into a powder having a particle size less than 500 μm, the bulk of the powder having particle size over 100 μm, removing any particles having a size over 250 μm, hot isostatic pressing said powder under temperature and pressure, said temperature being sufficiently low that no significant recrystallization takes place, said pressure being sufficiently high that a theoretical density over 93% is obtained.

2. Process as in claim 1 wherein said compacted material is ground into a powder having a particle size less than 250 μm.

3. Process as in claim 1 wherein said powder is mixed with ITO powder having a particle size of less than 10 μm prior to compacting.

4. Process as in claim 1 wherein said grinding is performed in a ball mill.

* * * * *